(12) United States Patent
Chen

(10) Patent No.: US 8,193,553 B2
(45) Date of Patent: Jun. 5, 2012

(54) SEMICONDUCTOR HIGH-POWER LIGHT-EMITTING MODULE WITH HEAT ISOLATION

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 0 days.

(21) Appl. No.: 12/444,734

(22) PCT Filed: Oct. 10, 2006

(86) PCT No.: PCT/CN2006/002646
§ 371 (c)(1),
(2), (4) Date: Jan. 27, 2010

(87) PCT Pub. No.: WO2008/043206
PCT Pub. Date: Apr. 17, 2008

(65) Prior Publication Data
US 2010/0127301 A1    May 27, 2010

(51) Int. Cl.
*H01L 33/00* (2010.01)
(52) U.S. Cl. .......... 257/99; 257/625; 257/675; 257/706; 257/717; 257/718; 257/720
(58) Field of Classification Search .............. 257/99, 257/625, 675, 706, 717, 718, 720
See application file for complete search history.

(56) References Cited

U.S. PATENT DOCUMENTS

| 6,530,420 | B1 | 3/2003 | Takada |
| 7,345,320 | B2 * | 3/2008 | Dahm .............................. 257/99 |
| 2004/0065894 | A1 | 4/2004 | Hashimoto |
| 2005/0045313 | A1 | 3/2005 | Scott |
| 2005/0092469 | A1 | 5/2005 | Huang |
| 2005/0231983 | A1 | 10/2005 | Dahm |
| 2006/0001384 | A1 * | 1/2006 | Tain et al. ..................... 315/246 |

(Continued)

FOREIGN PATENT DOCUMENTS
CN       2658940 Y       11/2004
(Continued)

OTHER PUBLICATIONS

Office Action in related Australian Patent Application mailed Nov. 15, 2010.

(Continued)

*Primary Examiner* — Tan N Tran
(74) *Attorney, Agent, or Firm* — Thomas, Kayden, Horstemeyer & Risley, LLP.

(57) ABSTRACT

The invention provides a semiconductor high-power light-emitting module including a heat-dissipating member, a heat-conducting device, and a diode light-emitting device. The heat-dissipating member includes an isolator member coupled to a first side of the heat-dissipating member. The heat-dissipating member has a second side opposite to the first side. The isolator member has a third side opposite to the first side. The environment temperature at the third side is higher than that at the second side. The heat-conducting device has a flat end and a contact portion tightly mounted on the heat-dissipating member. The diode light-emitting device is disposed on the flat end of the heat-conducting device. The semiconductor light-emitting module of the invention, applied to a headlamp of an automobile, has properties of saving electricity and long life, and furthermore the capability of integrating the heat-dissipating member into a shell of the automobile is both artistic and practical.

3 Claims, 5 Drawing Sheets

U.S. PATENT DOCUMENTS

2008/0239675 A1* 10/2008 Speier .......................... 361/712

FOREIGN PATENT DOCUMENTS

| CN | 2717027 | Y | 8/2005 |
| CN | 1664433 | A | 9/2005 |
| CN | 1740631 | A | 3/2006 |
| JP | 2002163912 | | 6/2002 |
| JP | 2003078174 | | 3/2003 |
| JP | 2004127782 | | 4/2004 |
| JP | 2005116990 | | 4/2005 |
| JP | 2005524201 | | 8/2005 |
| KR | 1020040090561 | | 11/2006 |
| WO | 2004055433 | | 7/2004 |
| WO | 2008043206 | | 4/2008 |

OTHER PUBLICATIONS

English Abstract of WO2004055433.
Office Action dated Mar. 18, 2010 in related Taiwan patent application No. 095136460.
English Translations of CN2717027Y, CN2658940Y, CN17410631A, CN1664433A.
Office Action in related patent application No. TW095136460.
English Abstract of JP2005116990.
English Abstract of JP2005524201.
English Abstract of JP2003078174.
English Abstract of JP2004127782.
English Abstract of KR1020040090561.
English Abstract of JP2002163912.
Office Action from the Korean Patent Office in related Application dated Nov. 10, 2010.
Office Action from the Japanese Patent Office in related Application dated Oct. 21, 2011.
English Abstract of WO2008/043206.
Office Action in related Malaysian Patent Application dated Jul. 29, 2011.

* cited by examiner

SEMICONDUCTOR HIGH-POWER LIGHT-EMITTING MODULE WITH HEAT ISOLATION

CROSS-REFERENCE TO RELATED APPLICATION

This application claims priority to PCT Application No. PCT/CN06/002646, filed Oct. 10, 2006.

BACKGROUND OF THE INVENTION

1. Field of the Invention

This invention relates to a semiconductor light-emitting module and, more particularly, to a semiconductor high-power light-emitting module with heat isolation.

2. Description of the Prior Art

Due to the advantages such as power saving, shock-resistance, fast response time, and adaptability for mass production, illumination equipment which applies light-emitting diodes is being researched and developed continuously. However, the heat which is generated by a high-power light-emitting diode also generates a lot of heat, so how to solve the problem of heat dissipation becomes a main issue in the field. Traditionally, a common way to dissipate heat is to put a heat-dissipating member (may includes a plurality of fins) at low temperature environment to dissipate heat. But in many practical applications, the heat-dissipating member is disposed in an environment with higher temperature. The junction temperature of the light-emitting diode remains high so that the luminous efficiency and the service life of the light-emitting diode are highly affected.

For example, halogen lamps are the mainstream in the traditional automobile headlight market, but the halogen lamps have disadvantages such as insufficient illumination and short service life. In order to improve the disadvantages, high intensity discharge lamps are adopted in the market presently. However, the lighting principle of the high intensity discharge lamps is to generate an electric arc between two electrodes to emit light, so a steady and continuous high voltage power supply is required. With regard to safety, drivers should be prevented from the circumstance with high voltage. If the headlight is replaced with the high-power light-emitting diode in the present market, at least one parts of its heat-dissipating member will be disposed in the vehicle body. It will cause the light-emitting diode to bear the heat generated by apparatuses such as the engine and thus become difficult to dissipate heat.

Accordingly, a semiconductor high-power light-emitting module which is capable of sufficiently dissipating heat in an environment with temperature differences should be provided to solve the above-mentioned problems.

SUMMARY OF THE INVENTION

A scope of the invention is to provide a semiconductor light-emitting module.

According to a preferred embodiment, the semiconductor light-emitting module of the invention includes a heat-dissipating member, a strip-shaped heat-conducting device, and a diode light-emitting device. The heat-dissipating member has an isolator member coupled to a first side of the heat-dissipating member. The heat-dissipating member has a second side opposite to the first side. The isolator member has a third side opposite to the first side. The environment temperature at the third side is higher than that at the second side. The heat-conducting device has a flat end and a contact portion. The contact portion is disposed between the heat-dissipating member and the isolator member and tightly mounted on the heat-dissipating member. The length-width ratio of the heat-conducting device is larger than 2. A bottom of the diode light-emitting device is tightly mounted on the flat end of the heat-conducting device. The diode light-emitting device is capable of transforming electric energy to a light. The heat-conducting device can be a heat pipe or other devices with high thermal conductivity efficiency. The diode light-emitting device includes at least one light-emitting diode die or at least one laser diode die. The contact portion of the heat-conducting device is mounted to the heat-dissipating member with a slab. During the operation of the diode light-emitting device, the generated heat can be conducted via the heat-conducting device to the heat-dissipating member and then be dissipated out.

According to the preferred embodiment, the semiconductor light-emitting module of the invention can be applied to a headlight of an automobile. The heat-dissipating member can be engaged on the body (e.g. the frame behind the bumper or the shell) of the automobile. Further, the position of the headlight is much closer to those of the apparatuses (e.g. an engine) with high temperature, so the semiconductor light-emitting module includes the isolator member for preventing the efficiency of the heat-dissipating member from the influence of the environment temperature produced by the above-mentioned apparatuses. Moreover, an isolator sleeve is used to cover the heat-conducting device between the diode light-emitting device and the contact portion to further reduce the influence of the heat generated by the above-mentioned apparatuses toward the environment temperature at the heat-dissipating member. In order to enhance heat dissipation efficiency, a plurality of fins are formed on the second side of the heat-dissipating member. Besides, the semiconductor light-emitting module further includes a control circuit which is electrically connected to the diode light-emitting device for controlling the diode light-emitting device to emit the light.

Accordingly, the semiconductor light-emitting module of the invention utilizes an isolator member to prevent the heat dissipation efficiency of the heat-dissipating member of the semiconductor light-emitting module from the influence of the environment with high temperature, so that the heat-dissipating member is capable of dissipating heat effectively in an environment with low temperature. If applied in the headlight of the automobile, the heat-dissipating member of the semiconductor light-emitting module of the invention can be integrally designed with the shell, which is not only aesthetic but also functional. Furthermore, by dissipating the heat generated during the operation of the diode light-emitting device out of the body of the automobile to the environment with lower temperature by means of the heat-dissipating member, it is able to dispose the high-power semiconductor light-emitting module in the headlight of the automobile.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
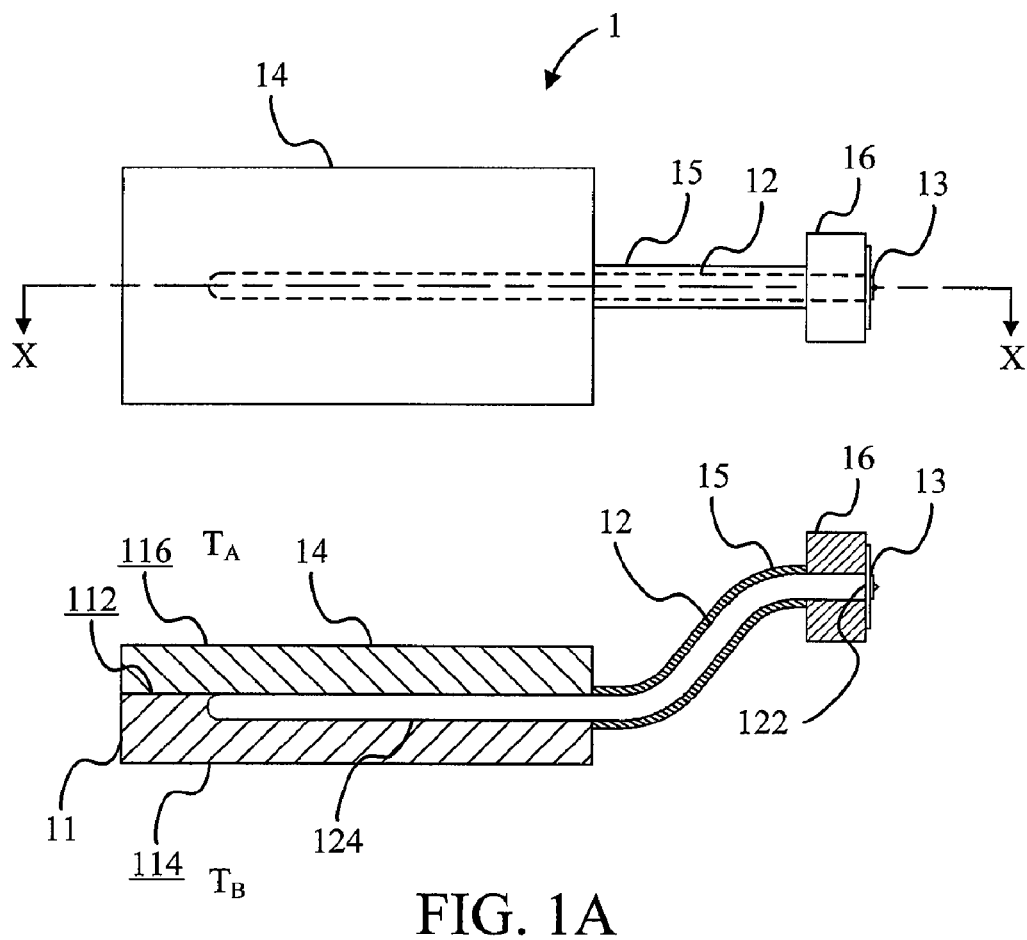
FIG. 1A is a schematic diagram illustrating a semiconductor light-emitting module X according to a first preferred embodiment of the invention.

Please refer to FIG. 1A. FIG. 1A is a schematic diagram illustrating a semiconductor light-emitting module 1 according to a first preferred embodiment of the invention. The lower drawing in FIG. 1A is a cross-sectional view of the upper drawing along line X-X. The semiconductor light-emitting module 1 includes a heat-dissipating member 11, a heat-conducting device 12, a diode light-emitting device 13, an isolator sleeve 15, and a carrier 16. The heat-dissipating member 11 has an isolator member 14 which is coupled to a first side 112 of the heat-dissipating member 11. The heat-dissipating member 11 has a second side 114 opposite to the first side 112. The isolator member 14 has a third side 116 opposite to the first side 112. The environment temperature at the third side 116 is higher than that at the second side 114. The heat-conducting device 12 has a flat end 122 and a contact portion 124. The contact portion 124 is disposed between the heat-dissipating member 11 and the isolator member 14 and tightly mounted on the heat-dissipating member 11. The length-width ratio of the heat-conducting device 12 is larger than 2. The carrier 16 has a hole for the heat-conducting device 12 to pass through. The heat-conducting device 12 passes through the hole, and the flat end 122 is substantially at the same level with a surface of the carrier 16. A bottom of the diode light-emitting device 13 is tightly mounted on the flat end 122 of the heat-conducting device 12 and the carrier 16. The diode light-emitting device 13 is capable of transforming electric energy to a light. The heat-conducting device 12 can be a heat pipe or other devices with high thermal conductivity efficiency. The diode light-emitting device 13 includes at least one light-emitting diode die or at least one laser diode die.

Figure 1B:
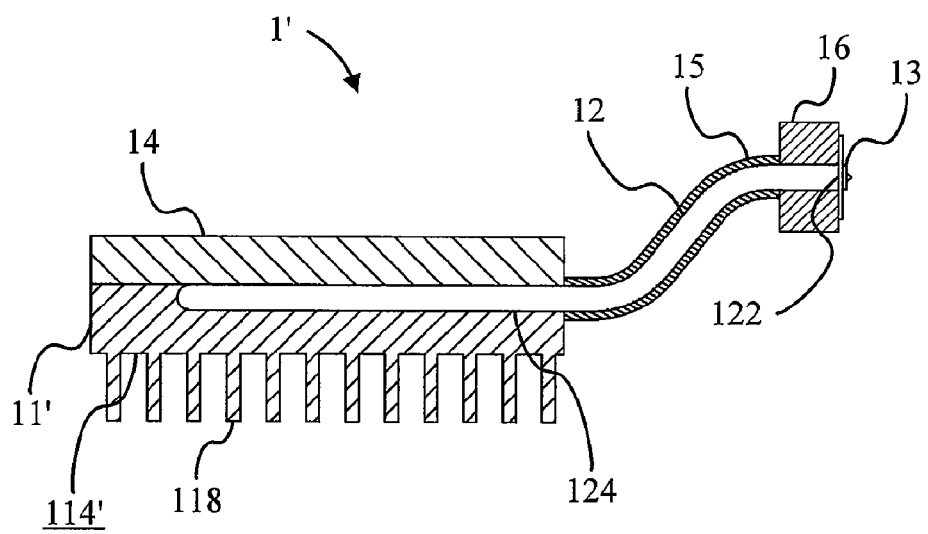
FIG. 1B is a schematic diagram illustrating a semiconductor light-emitting module X' according to another embodiment of the invention.

According to the first preferred embodiment, the contact portion 124 of the heat-conducting device 12 totally sinks into the heat-dissipating member 11, and the heat-conducting device 12 directly mounts on the heat-dissipating member 11 with the isolator member 14. Further, the isolator sleeve 15 covers the heat-conducting device 12 between the diode light-emitting device 13 and the contact portion 124. The isolator member 14 is capable of preventing the heat-dissipating member 11 from the influence of the environment with high temperature. As shown in the lower drawing in FIG. 1A, the configuration can make the semiconductor light-emitting module 1 to be applied to the situation that the environment temperature $T_A$ of the isolator member 14 is higher than the environment temperature $T_B$ of the heat-dissipating member 11. Moreover, comparing the first preferred embodiment with another embodiment shown in FIG. 1B, a plurality of fins are formed on a second side 114' of a heat-dissipating member 11' of a semiconductor light-emitting module 1' to enhance heat dissipation efficiency.

Figure 1C:
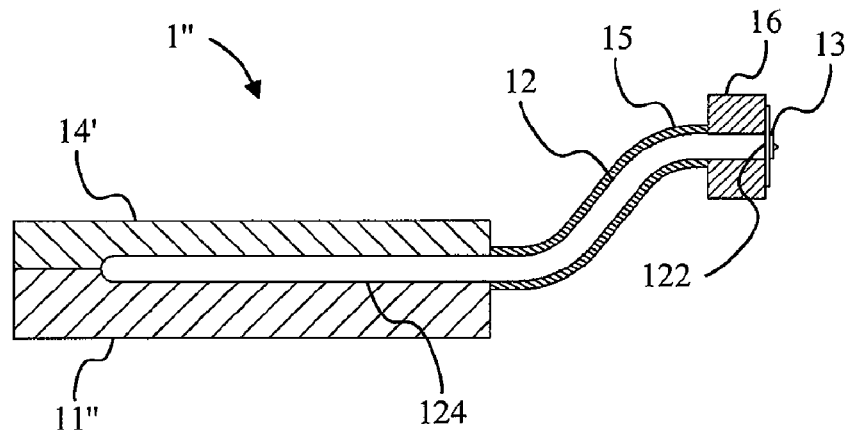
FIG. 1C is a schematic diagram illustrating a semiconductor light-emitting module X" according to another embodiment of the invention.
Figure 1D:
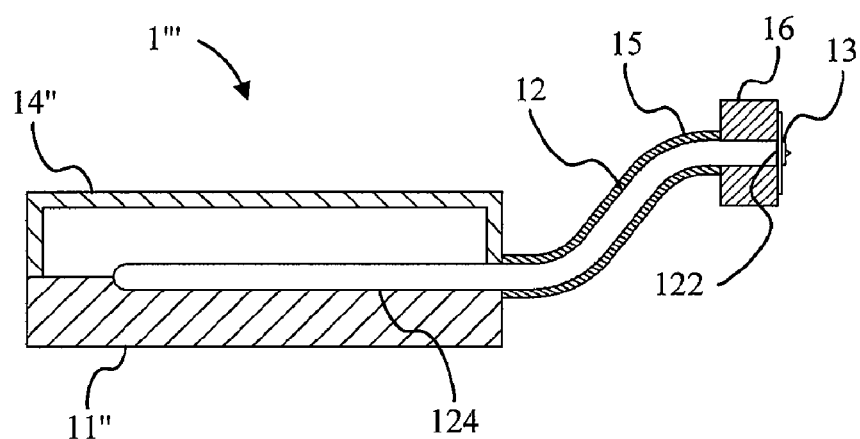
FIG. 1D is a schematic diagram illustrating a semiconductor light-emitting module X''' according to another embodiment of the invention.
Figure 1E:
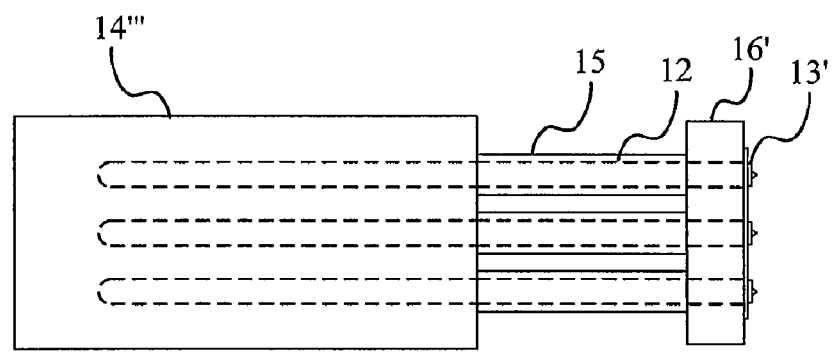
FIG. 1E is a schematic diagram illustrating a semiconductor light-emitting module according to another embodiment of the invention.

Besides, comparing the first preferred embodiment with another embodiment shown in FIG. 1C, the contact portion 124 of a semiconductor light-emitting module 1" can also partially sink into a heat-dissipating member 11", and the heat-conducting device 1" directly mounts on the heat-dissipating member 11" with a isolator member 14'. Furthermore, comparing the first preferred embodiment with another embodiment shown in FIG. 1D, an isolator member 14" of a semiconductor light-emitting module 1''' and the heat-dissipating member 11" form a space which has a clearance to contain the contact portion 124. The contact portion 124 still can be mounted by the isolator member 14" or with a slab (not shown in FIG. 1D). Finally, according to another embodiment shown in FIG. 1E, a semiconductor light-emitting module includes three diode light-emitting devices 13' which are disposed between an isolator member 14''' and a heat-dissipating member. Comparing with the first preferred embodiment, the diode light-emitting devices 13' can be packaged entirely or individually. The package structure will be explained in more details below.

It is notable that the space is not necessary to be sealed and it is better to enhance the thermal conductivity efficiency of the heat-conducting device 12 from the contact portion 124 to the heat-dissipating member 11, 11', and 11". For example, squash the contact portion 124 or fill the clearance between the contact portion 124 and the heat-dissipating member 11, 11', and 11" with a thermal conductive material to increase the contacting area.

Figure 2A:
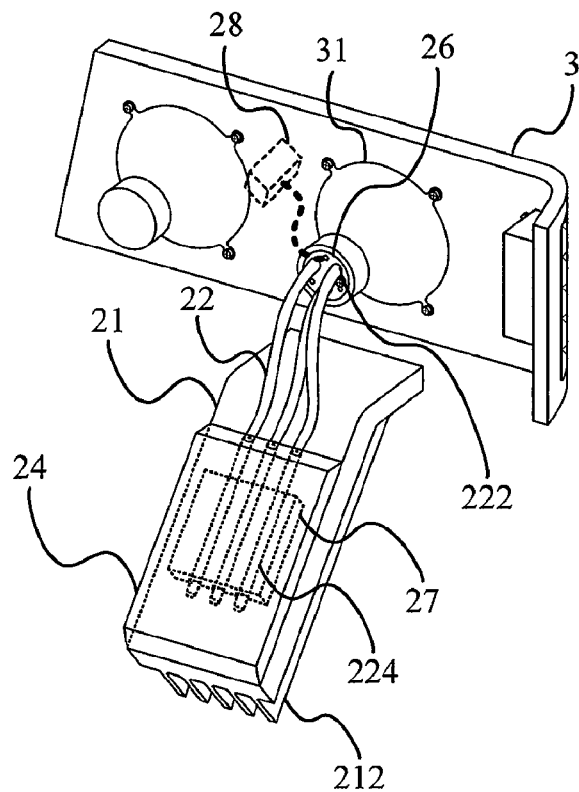
FIG. 2A is a pictorial drawing illustrating a semiconductor light-emitting module according to a second preferred embodiment of the invention which is applied to a headlight of automobiles.
Figure 2B:
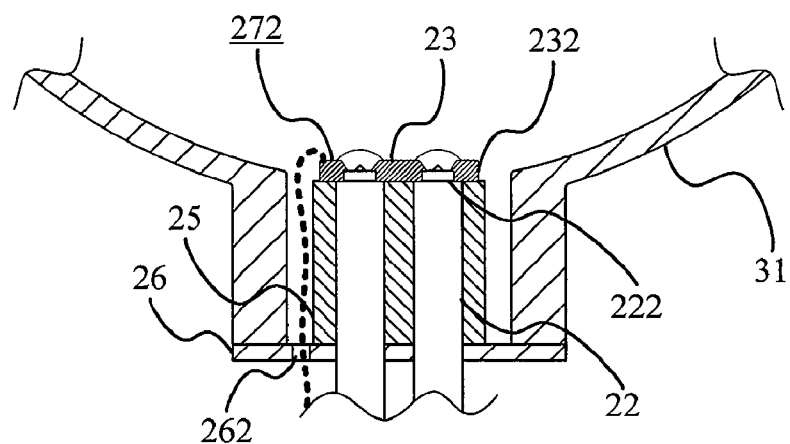
FIG. 2B is a cross-sectional view illustrating a lamp holder of the headlight.

Please refer to FIG. 2A and FIG. 2B. FIG. 2A is a pictorial drawing illustrating a semiconductor light-emitting module according to a second preferred embodiment of the invention which is applied to a headlight 3 of an automobile. FIG. 2B is a cross-sectional view illustrating a lamp holder 31 of the headlight 3. According to the second preferred embodiment, a right headlight of an automobile is consisted of the structure of the semiconductor light-emitting module. It is notable that the invention is not limited to the right headlight.

The semiconductor light-emitting module of the invention includes a heat-dissipating member 21, three heat-conducting devices 22, three diode light-emitting devices 23, an isolator member 24, a carrier 25, and a supporter 26.

Each heat-conducting device 22 has a flat end 222 and a contact portion 224. The contact portion 224 is tightly mounted to the heat-dissipating member 21. The carrier 25 has a hole for the heat-conducting device 22 to pass through. The heat-conducting device 22 passes through the hole, and the flat end 222 is substantially at the same level with a surface of the carrier 25. The diode light-emitting devices 23 are disposed on the flat ends 222 of the heat-conducting devices 22 respectively. Each diode light-emitting device 23 is capable of transforming electric energy to a light. The heat-conducting devices 22 can be a heat pipe or other devices with high thermal conductivity efficiency. The diode light-emitting devices 23 include at least one light-emitting diode die or at least one laser diode die.

According to the second preferred embodiment, the contact portions 224 of the heat-conducting devices 24 are mounted to the heat-dissipating member 21 with a slab 27. During the operation of the diode light-emitting devices 23, the generated heat can be conducted via the heat-conducting devices 22 to the heat-dissipating member 21 and then be dissipated out.

Further, the position of the headlight is much closer to those of apparatuses (e.g. an engine) with high temperature, so the isolator member 24 is disposed between the above-mentioned apparatuses and the heat-dissipating member 21 for preventing the efficiency of the heat-dissipating member 21 from the influence of the environment with high temperature (usually over 80° C.) produced by the above-mentioned apparatuses. Therefore, the isolator member 24 can be used as the slab 27 which has functions of isolating heat and mounting.

Besides, the contact portion 224 of the heat-conducting device 24 can also be mounted by other ways, such as attaching the contact portion 224 on the heat-dissipating member 21 with a material like gel, or welding. And, in order to increase the thermal conductivity efficiency from the contact portion 224 to the heat-dissipating member 21, the contact portion 124 can be squashed to form a larger contact area, or the clearance between the contact portion 224 and the heat-dissipating member 21 can be filled with a thermal conductive material to increase thermal conductivity area. In another embodiment, a plurality of fillisters can be formed on a heat-dissipating member to respectively contain a plurality of heat-conducting devices, or a fillister can be formed on the heat-dissipating member to contain the heat-conducting devices. The shape of the fillisters can be formed in accordance with the heat-conducting devices, or the shape of the heat-conducting devices can be formed in accordance with the fillisters. Meanwhile, an isolator member can directly cover the fillisters to provide functions of isolating heat and mounting.

It is notable that according to the second preferred embodiment, the effect of preventing the efficiency of the heat-dissipating member 21 from the influence of the environment with high temperature produced by the above-mentioned apparatuses also can replace the action of covering the isolator member 24 or the like on the heat-dissipating member 21 and the contact portions 224 of the heat-conducting devices 22.

Moreover, an isolator sleeve (not shown in figures) can be used to cover the heat-conducting device 22 between the diode light-emitting device 23 and the contact portion 224 or the heat-conducting device 22 which is exposed out of the isolator member 24 to further reduce the influence of the environment with high temperature produced by the above-mentioned apparatuses toward the efficiency of the heat-dissipating member. The isolator sleeve can cover a plurality of heat-conducting devices 22, or a plurality of isolator sleeves respectively cover the heat-conducting devices 22. The isolator sleeve is not limited to the form of a sleeve; it can work in the form of an adhesive tape or by directly spreading an isolation material layer on it to achieve the effects of thermal isolation/reduction of thermal conductivity. Besides, in order to enhance the heat dissipation efficiency, a plurality of fins 212 can be formed on the heat-dissipating member 21 to increase the area for dissipating. It is worthy to be mentioned that in the preferred embodiments, the area of which the isolator members cover the heat-dissipating member should be enlarged as possible to effectively prevent the efficiency of the heat-dissipating member from the influence of the environment with high temperature produced by the above-mentioned apparatuses.

According to the second preferred embodiment, the carrier 25 has three holes for the heat-conducting devices 22 to pass through and allows the diode light-emitting devices 23 to be disposed on the flat end 222 of the heat-conducting devices 22. The substrate 232 of the diode light-emitting devices 23 is disposed on the carrier 25. An electrode of a control circuit 28 is formed on or carried to connect to a surface 272 of the substrate 232. The electric wire which is connected to the electrode is electrically connected to the control circuit 28 via an aperture 262 of the supporter 26. The supporter 26 engages the heat-conducting devices 22 to the lamp holder 31. The supporter 26 and the carrier 25 can be monolithically molded. According to the second preferred embodiment, the supporter 26 is locked on the lamp holder 31 with screws. However, the supporter 26 can also be mounted on the lamp holder 31 by attaching or hooking, or be alternatively mounted on other portions of the lamp holder 31.

Figure 2C:
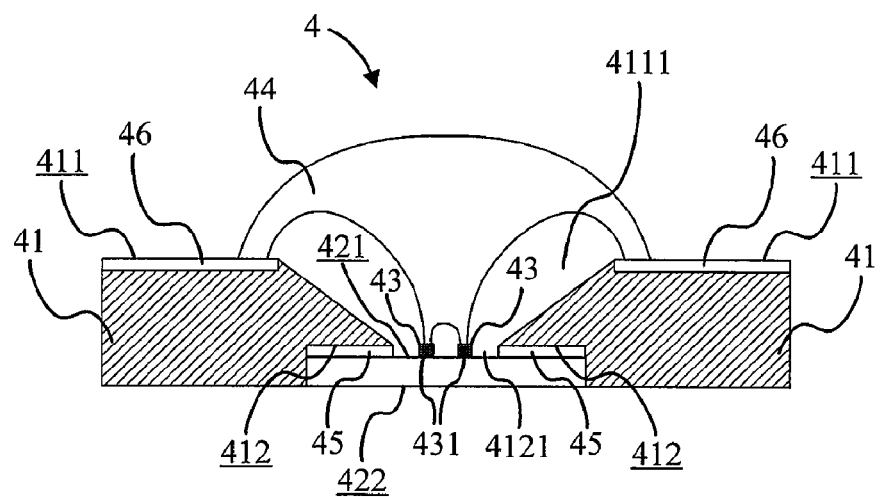
FIG. 2C is a cross-sectional view illustrating a light-emitting diode package structure.

Besides, the diode light-emitting devices 23 can be packaged together with the substrate 232. Please refer to FIG. 2C. FIG. 2C is a cross-sectional view illustrating a light-emitting diode package structure 4. The package structure 4 includes a substrate 41, a lower sub-mount 42, at least one semiconductor light-emitting die 43, and a package material 44. The substrate 41 thereon defines a top surface 411, and a plurality of outer electrodes 46 are disposed on the top surface 411. The lower sub-mount 42 thereon defines a first surface 421, and the at least one semiconductor light-emitting die 43 is mounted to the first surface 421 of the lower sub-mount 42 with an inter electrode (i.e. a bond pad) of the bottom 431. A first recess portion 4111 is formed on the top surface 411 of the substrate 41. The substrate 41 thereon defines a bottom surface 412. A second recess portion 4121 is formed on the bottom surface 412 of the substrate 41, and the second recess portion 4121 and the first recess portion 4111 are connected to each other. The lower sub-mount 42 is embedded in the second recess portion 4121. The lower sub-mount 42 thereon further defines a second surface 422, and the first surface 421 of the lower sub-mount 42 is exposed to the interior of the first recess portion 4111. The bottom 431 of the at least one semiconductor light-emitting die 43 is mounted to the part of the first surface 421 of the lower sub-mount 42 which is exposed to the interior of the first recess portion 4111. The package material 44 is used to be filled into the first recess portion 4111 to cover the at least one semiconductor light-emitting die 43. The at least one semiconductor light-emitting die 43 has an inter electrode which is electrically connected to the outer electrodes 46 of the top surface 411. The connection between the inter electrode of at least one semiconductor light-emitting die 43 and the outer electrode 46 is a series connection, but the connection between the electrodes can also be a parallel connection to achieve the same purpose of the invention.

Figure 2D:
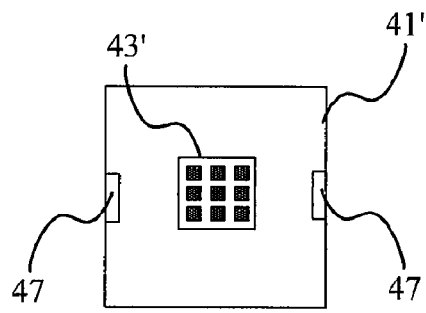
FIG. 2D is a cross-sectional view illustrating another light-emitting diode package structure.

Furthermore, a heat-conducting gel 45 can be disposed between the first surface 421 of the lower sub-mount 42 and the bottom of the first recess portion 4111, so as to combine the first surface 421 of the lower sub-mount 42 with the bottom of the first recess portion 4111. That is to say, the heat-conducting gel 45 is used to connect the substrate 41 with the lower sub-mount 42. The substrate 41 can be formed by metal, ceramic, a flexible printed circuit board, or a rigid printed circuit board. The lower sub-mount 42 can be composed of semiconductor. It is worthy to be mentioned that the package of the diode light-emitting devices 23 are not limited to the above description. The diode light-emitting devices 23 can also be disposed on the substrate 41' rather than adopting the design of the first recess portion 4111 and the second recess portion 4121, as shown in FIG. 2D. Two electrodes 47 exposed on the substrate 41' are used for connecting outer circuits.

Figure 2E:
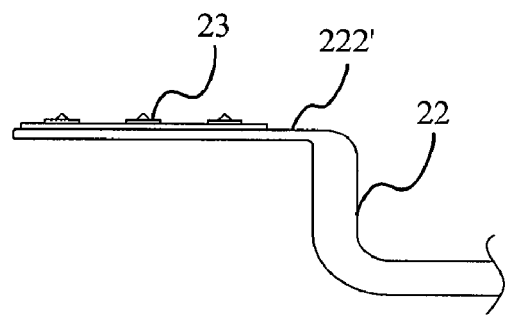
FIG. 2E is a schematic diagram illustrating another kind of flat end of the heat-conducting device according to the second preferred embodiment of the invention.

It is notable that each heat-conducting device 22 is not limited to carry only one diode light-emitting device 23. Each heat-conducting device 22 can carry a plurality of diode light-emitting devices 23. In the situation, the flat end 222' of the heat-conducting device 22 is different from the foregoing flat end 222. The larger flat end 222' is formed by extruding an end of the heat-conducting device 22, as shown in FIG. 2E. The selection of the two kinds of flat end depends on the actual design of a product. And, the number of the diode light-emitting device and the space are important factors for making the decision. In this circumstance, both the geometric dimensions of the carrier 25 and the substrate 232 need to be modified accordingly.

Figure 3:
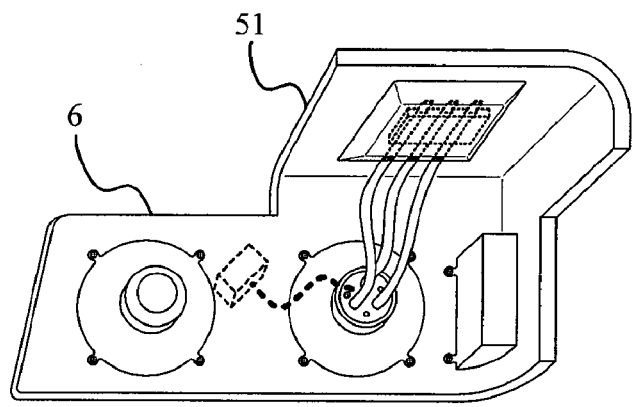
FIG. 3 is a pictorial drawing illustrating a semiconductor light-emitting module according to a third preferred embodiment of the invention which is applied to a headlight of an automobile.
Figure 4:
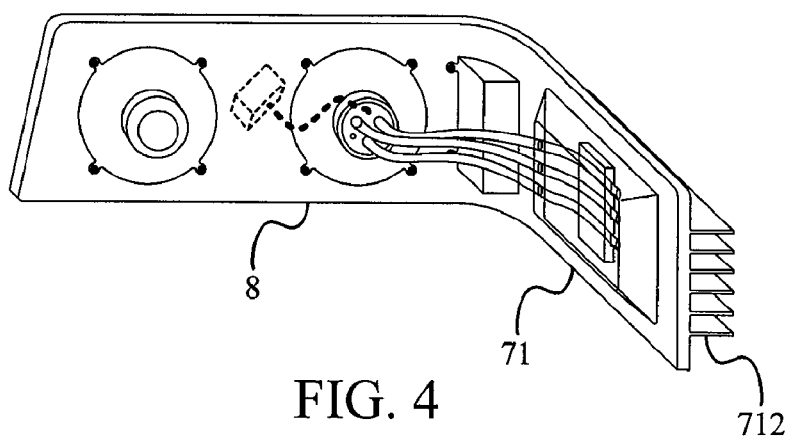
FIG. 4 is a pictorial drawing illustrating a semiconductor light-emitting module according to a fourth preferred embodiment of the invention which is applied to a headlight of an automobile.

Please refer to FIG. 3. FIG. 3 is a pictorial drawing illustrating a semiconductor light-emitting module according to a third preferred embodiment of the invention which is applied to a headlight 6 of an automobile. Compared with the second preferred embodiment, the heat-dissipating member 51 of the semiconductor light-emitting module of the third preferred embodiment is engaged to the shell near the hood of the automobile, which is different from the second preferred embodiment that the heat-dissipating member 21 of the semiconductor light-emitting module 2 is engaged on the body (e.g. the frame behind the bumper) of the automobile. Please refer to FIG. 4. FIG. 4 is a pictorial drawing illustrating a semiconductor light-emitting module according to a fourth preferred embodiment of the invention which is applied to a headlight 8 of an automobile. Compared with the second preferred embodiment and the third preferred embodiment, the heat-dissipating member 71 of the semiconductor light-emitting module of the fourth preferred embodiment is engaged to the front side shell of the automobile.

Figure 5:
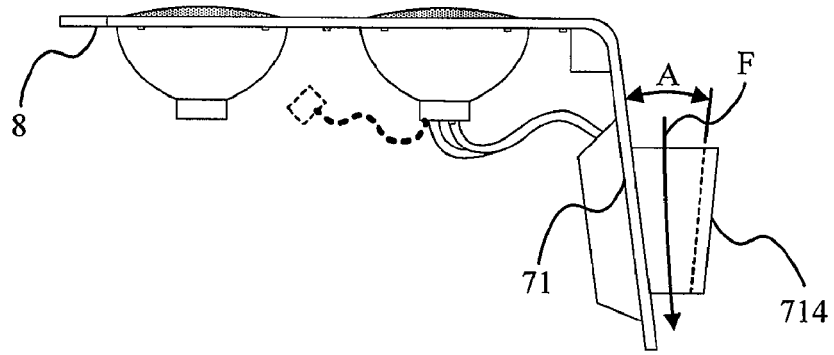
FIG. 5 is a schematic diagram illustrating another type of fin of the heat-dissipating member of the fourth preferred embodiment.

Taking the fourth preferred embodiment for example, the heat dissipation efficiency of the heat-dissipating member 71 can be increased by changing the outer structure of the heat-dissipating member 71 except for forming the fins 712 on the heat-dissipating member 71. For example, the area for dissipating heat of the heat-dissipating member 71 can be increased by increasing the surface roughness or applying other patterns. Or the heat-dissipating member 71 can be formed a layer of fins outward and parallel to the fins 712 on the heat-dissipating member 71. An included angle A (shown in FIG. 5, which is a top view illustrating the fourth preferred embodiment) between the two layers of fins can be designed not only to increase area for dissipating heat but also to increase the velocity and the density of fluid F which flows between the layers of fins to increase the heat dissipation efficiency. Furthermore, according to the third preferred embodiment, it is possible to have fins formed at the outside of the heat-dissipating member 51 although there is no one in this case. And, any fin or any structure assisting to dissipate heat, formed on the heat-dissipating member 51, or any surface treatment applied to the heat-dissipating member 51 should comply with the design of the automobile.

Therefore, according to the preferred embodiments, the semiconductor light-emitting module of the invention utilizes an isolator member to prevent the heat dissipation efficiency of the heat-dissipating member of the semiconductor light-emitting module from the influence of the environment with high temperature, so that the heat-dissipating member is capable of dissipating heat effectively at an environment with low temperature. In other words, the heat-dissipating member of the semiconductor light-emitting module is able to be normally operated at an environment with temperature differences. The application field of the semiconductor light-emitting module of the invention is not limited to the headlight of the auto mobile mentioned in the preferred embodiments. If there are existing temperature differences at operating environment and a requirement for dissipating heat, the semiconductor light-emitting module of the invention can be applied. But, the geometric dimension of the heat-dissipating member needs to comply with the operating environment.

If applied in the headlight of the automobile, the heat-dissipating member of the semiconductor light-emitting module of the invention can be integrally designed with the shell, which is not only aesthetic but also functional. Furthermore, by dissipating the heat generated during the operation of the diode light-emitting device out of the body of the automobile to the environment with lower temperature by the heat-dissipating member, it is able to realize that the high-power semiconductor light-emitting module is disposed in the headlight of the automobile. At the same time, although a part of the heat-dissipating member is disposed at the environment with high temperature, the heat-dissipating member still has good heat dissipation efficiency by using the isolator to prevent the heat dissipation efficiency of the heat-dissipating member of the semiconductor light-emitting module from the influence of the environment with high temperature. Besides, because light-emitting diodes have various kinds of colors, the semiconductor light-emitting module can have functions of indication/illumination, such as integrating a fog lamp and common illumination functions into a semiconductor light-emitting module.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:
1. A semiconductor light-emitting module, comprising:
   a heat-dissipating member, having a first side and the second side, the second side being opposite to the first side;
   a plurality of heat dissipating fins, formed on the second side of the heat-dissipating member and extending outward therefrom for dissipating heat, the heat dissipating fins and the heat-dissipating member being one piece formed;
   an heat isolating member, coupled to the first side of the heat-dissipating member, the heat isolating member having a third side opposite to the first side of the heat-dissipating member;
   a heat pipe having a flat end and a contact portion, the contact portion being disposed between the heat-dissipating member and the heat isolating member and mounted on the heat-dissipating member;
   a diode light-emitting device, a bottom of the diode light-emitting device being mounted on the flat end of the heat pipe; and a heat isolator sleeve, covering the surface of the heat pipe between the diode light-emitting device and the contact portion.

2. The semiconductor light-emitting module of claim 1, wherein the length-width ratio of the heat pipe is larger than 2.

3. The semiconductor light-emitting module of claim 1, wherein the diode light-emitting device comprises at least one light-emitting diode die or at least one laser diode die.

* * * * *